US008922258B2

(12) United States Patent
Taguchi et al.

(10) Patent No.: US 8,922,258 B2
(45) Date of Patent: Dec. 30, 2014

(54) SWITCHING ELEMENT DRIVER IC AND SWITCHING ELEMENT DRIVER DEVICE EQUIPPED WITH THE SAME

(71) Applicant: Denso Corporation, Kariya (JP)

(72) Inventors: Masatoshi Taguchi, Kariya (JP); Tsuneo Maebara, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 14/015,376

(22) Filed: Aug. 30, 2013

(65) Prior Publication Data

US 2014/0077846 A1 Mar. 20, 2014

(30) Foreign Application Priority Data

Sep. 18, 2012 (JP) ................................ 2012-204547

(51) Int. Cl.
 *H03K 3/00* (2006.01)
 *H03K 3/01* (2006.01)
 *H02M 1/08* (2006.01)

(52) U.S. Cl.
 CPC .. *H03K 3/01* (2013.01); *H02M 1/08* (2013.01)
 USPC .............................. 327/109; 363/131; 326/83

(58) Field of Classification Search
 CPC .......... H03K 17/04126; H03K 17/063; H03K 2217/0036; H03K 19/00361; H04L 25/028; H04L 25/0272; H02M 7/537; H02M 7/003; Y02B 70/1441
 USPC ......... 327/108–112, 398; 326/82, 83; 363/55, 363/124, 131; 307/109, 64; 318/139; 323/315
 See application file for complete search history.

(56) References Cited

U.S. PATENT DOCUMENTS

| 8,525,371 B2 * | 9/2013 | Shindo et al. ................. 307/109 |
| 8,610,487 B2 * | 12/2013 | Itou et al. ...................... 327/398 |
| 2012/0063187 A1 * | 3/2012 | Sato et al. ..................... 363/131 |
| 2012/0112530 A1 * | 5/2012 | Komatsu et al. ............... 307/9.1 |
| 2012/0217906 A1 * | 8/2012 | Hamanaka et al. ........... 318/139 |
| 2012/0235488 A1 * | 9/2012 | Hamanaka et al. ............ 307/64 |
| 2013/0127438 A1 * | 5/2013 | Takagiwa ...................... 323/315 |
| 2013/0181640 A1 * | 7/2013 | Fukuta et al. ................. 318/139 |
| 2014/0023110 A1 * | 1/2014 | Hamanaka et al. ........... 374/142 |
| 2014/0092653 A1 * | 4/2014 | Suzuki et al. ................... 363/55 |

OTHER PUBLICATIONS

"1.5 Amp Output Current IGBT Gate Driver Optocoupler with Integrated (VCE) Desaturation Detection, UVLO, Fault Feedback, Active Miller Clamp and Auto-Fault Reset"; ACPL-330J Data Sheet; Avago Technologies; pp. 1-21, Oct. 25, 2012.

* cited by examiner

*Primary Examiner* — Lincoln Donovan
*Assistant Examiner* — Thomas Skibinski
(74) *Attorney, Agent, or Firm* — Nixon & Vanderhye PC

(57) ABSTRACT

A switching element driver IC has one or more photocouplers, a driver circuit, a detection circuit and a setting circuit. The photocoupler receives setting data transmitted from a microcomputer, and transmits the received setting data to the setting circuit, wherein an input side as a high voltage side is electrically insulated from an output side as a low voltage side in the photocoupler. The setting circuit transmits the setting data to the driver circuit and the detection circuit. The driver circuit and the detection circuit operate on the basis of the received setting data. The setting data can be provided to the driver circuit and the detection circuit through the photocoupler and the setting circuit. This structure makes it possible to suppress increasing the number of terminals at the high voltage side of the switching element driver IC, and decrease the entire size of the switching element driver IC.

10 Claims, 3 Drawing Sheets

# SWITCHING ELEMENT DRIVER IC AND SWITCHING ELEMENT DRIVER DEVICE EQUIPPED WITH THE SAME

CROSS-REFERENCE TO RELATED APPLICATION

This application is related to and claims priority from Japanese Patent Application No. 2012-204547 filed on Sep. 18, 2012, the contents of which are hereby incorporated by reference.

BACKGROUND OF THE INVENTION

1. Field of the Invention

The present invention relates to switching element driver integrated circuits (ICs) having insulation circuits such as photocouplers, and switching element driver devices equipped with the switching element driver IC.

2. Description of the Related Art

There are various types of switching element driver ICs equipped with one or more insulation circuits such as photocouplers. For example, there is a prior art document, "ACPL-330J, 1.5 Amp Output Current IGBT Gate Driver Optocoupler with Integrated (VCE) Desaturation Detection, UVLO, fault Feedback, Active Miller Clamp and Auto-Fault Reset, Data Sheet, AVAGO TECHNOLOGIES", which has disclosed an insulated gate bipolar transistor (IGBT) gate driver IC.

The IGBT gate driver IC receives a driving signal and drives an IGBT on the basis of the received driving signal. Further, the IGBT gate driver IC detects occurrence of excess current and short circuit in the IGBT. When detecting occurrence of excess current and/or short circuit, generates and outputs a fault signal to outside devices. The IGBT gate driver IC is comprised of a first photocoupler (or a first optocoupler), a drive circuit, a detection circuit and a second photocoupler (or a second optocoupler).

The first photocoupler receives a driving signal transmitted from a device in a low voltage side, and transmits a signal to a high voltage side corresponding to the received driving signal, wherein the low voltage side is electrically insulated from the high voltage side in the first photocoupler. The driver circuit is electrically connected to the first photocoupler, and receives the signal transmitted from the first photocoupler. The driver circuit drives the IGBT on the basis of the received driving signal. The detection circuit detects occurrence of excess current and short circuit. The detection circuit outputs the detection result. Because the second photocoupler is electrically connected to the detection circuit, the second photocoupler receives the detection result transmitted from the detection circuit, and generates and transmits a fail signal corresponding to the received detection result, wherein the high voltage side is electrically insulated from the high voltage side in the second photocoupler.

On driving the IGBT as a target to be controlled and detected, it is necessary for each of the driver circuit and the detection circuit to have a gate voltage threshold value and an abnormality detection threshold value, etc. which are determined when the IGBT is turned on and off. In order to use various types of IGBT devices, an outside device determines such a gate voltage threshold value and an abnormality detection threshold value every IGBT device, and the IGBT gate driver IC uses those threshold values. However, this needs the high voltage side of the IGBT gate driver IC to have an increased number of terminals when compared with the number of terminals at the low voltage side thereof. When using driver circuits and detection circuits having high functionality, it is necessary for the IGBT gate driver IC to have the increased number of terminals at the high voltage side.

In order to adequately maintain the electrical insulation in the IGBT gate driver IC, it is necessary to arrange the terminals at the low voltage side and the high voltage side of the IGBT gate driver IC at a predetermined interval. If the number of the terminals at the high voltage side increases when compared with the number of the terminals at the low voltage side, an entire size of the IGBT gate driver IC therefore increases.

SUMMARY

It is therefore desired to provide a switching element driver IC and a switching element driver device equipped with the switching element river IC having a reduced size and capable of suppressing increasing of the number of terminals, while maintaining its functionality.

An exemplary embodiment provides a switching element driver integrated circuit having a first insulation circuit, a driver circuit, a detection circuit, a second insulation circuit, a third insulation circuit and a setting circuit. The first insulation circuit receives a driving signal transmitted from a control device such as a microcomputer and transmits the received driving signal, wherein an input side is insulated from an output side in the first insulation circuit. The driver circuit is connected to the first insulation circuit and configured to receive the driving signal transmitted from the first insulation circuit. The driver circuit drives a switching element on the basis of the received driving signal. The detection circuit detects operation state of the switching element and generates a detection signal on the basis of a detection result. The second insulation circuit is connected to the detection circuit, receives the detection signal transmitted from the detection circuit, and outputs the detection signal, wherein an input side is electrically insulated from an output side in the second insulation circuit. The third insulation circuit transmits setting data to the driver circuit and the detection circuit, wherein an input side is electrically insulated from an output side in the third insulation circuit. The setting circuit is connected to the third insulation circuit, the driver circuit and the detection circuit. The setting circuit receives the setting data transmitted from the third insulation circuit and provides the received setting data to the driver circuit and the detection circuit. The driver circuit and the detection circuit operate on the basis of the received setting data.

Another exemplary embodiment provides a switching element driver device equipped with a microcomputer which acts the control device and the switching element driver IC which has the structure previously described.

The structure of the switching element driver IC makes it possible to provide the setting data to the driver circuit and the detection circuit through the third insulation circuit and the setting circuit. This structure makes it possible to decrease the number of dedicated terminals which receive setting data corresponding to various types of IGBTs transmitted from various outside devices, and to decrease the entire size of the switching element driver IC.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
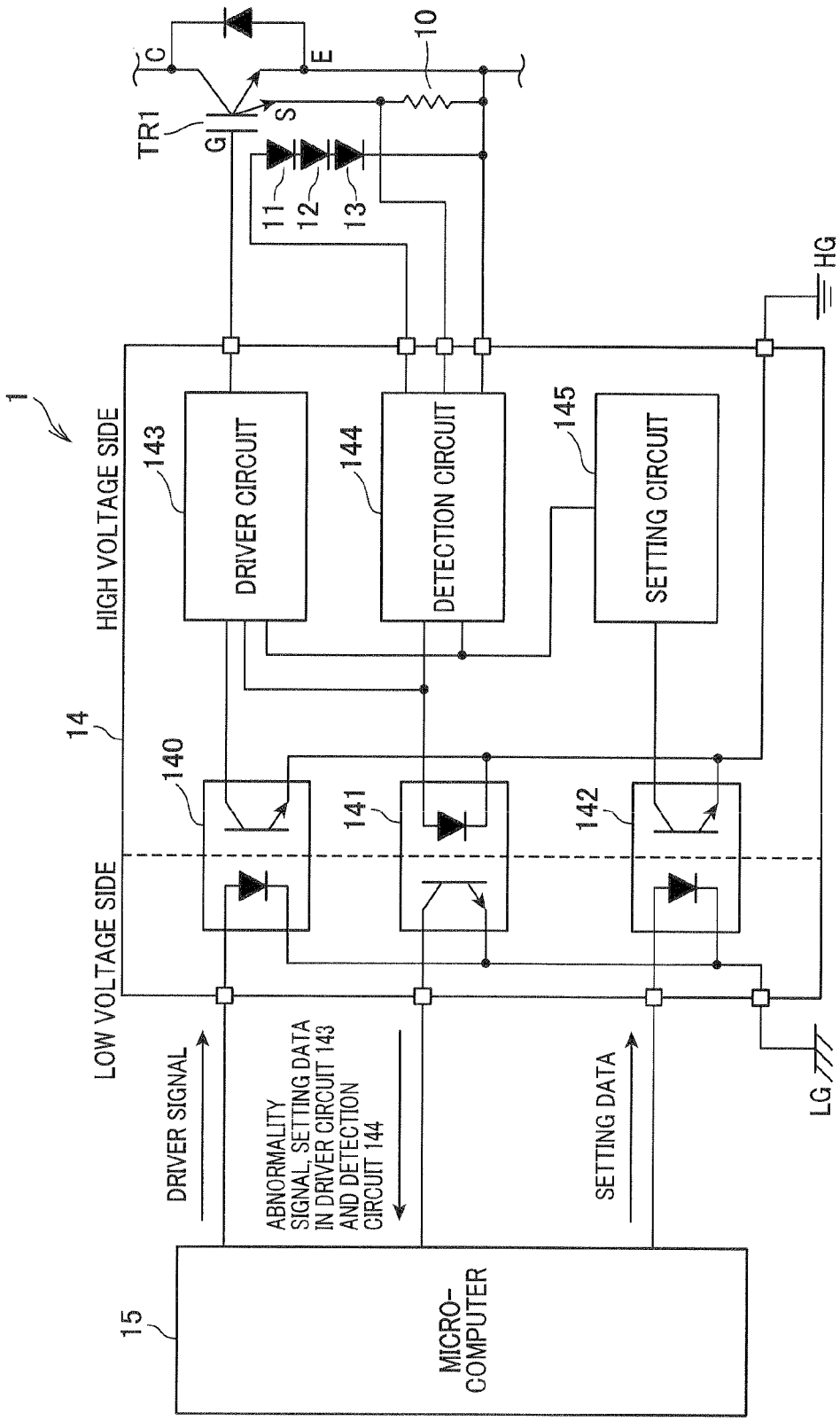
FIG. 1 is a view showing a circuit structure of a switching element driver device equipped with a switching element driver IC according to a first exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

The following description will disclose the concept of the switching element driver integrated circuit (switching element driver IC) applied to various exemplary embodiments of a switching element driver device.

First Exemplary Embodiment

A description will be given of a circuit structure of a switching element driver device 1 equipped with a switching element driver IC 14 according to a first exemplary embodiment.

FIG. 1 is a view showing a circuit structure of the switching element driver device 1 equipped with a switching element driver IC 14 according to the first exemplary embodiment.

The switching element driver device 1 operates at a low voltage and drives a switching element TR1. A high voltage is supplied to the switching element TR1. The switching element TR1 is driven by controlling a voltage of a gate (G) thereof. Specifically, the switching element TR1 is comprised of an insulated gate bipolar transistor (IGBT). The switching element TR1 has a current sensitive terminal S through which a current flows, which is smaller than a collector current and proportional to the collector current. The switching element driver device 1 shown in FIG. 1 is comprised of a current sense resistance 10, temperature sensitive diodes 11, 12 and 13, a switching element driver IC 14, and a microcomputer 15. The microcomputer 15 is the control device used in the claims because the microcomputer 15 is arranged outside of the switching element driver IC 14.

The current sense resistance 10 converts a current which flows in the switching element TR1 into a voltage. Specifically, the current sense resistance 10 converts a current which flows through the current sensitive terminal S of the switching element TR1 to a voltage.

One terminal of the current sense resistance 10 is connected to the current sense terminal S of the switching element TR1, and the other terminal of the current sense resistance 10 is connected to an emitter terminal E of the switching element TR1. Both ends of the current sense resistance 10 are connected to the switching element driver IC 14.

Each of the temperature sensitive diodes 11, 12 and 13 converts detected data regarding a temperature of the switching element TR1 to a voltage. Specifically, When receiving a constant current, each of the temperature sensitive diodes 11, 12 and 13 outputs a voltage corresponding to a temperature of the switching element TR1. The switching element TR1 is integrated with the temperature sensitive diodes 11, 12 and 13, where the temperature sensitive diodes 11, 12 and 13 are connected in series. An anode of the temperature sensitive diode 11 is connected to the switching element driver IC 14, a cathode of the temperature sensitive diode 11 is connected to an emitter of the switching element TR1.

The switching element driver IC 14 operates on the basis of data transmitted from the microcomputer 15. When receiving the data provided from the microcomputer 15, the switching element driver IC 14 drives the switching element TR1 on the basis of the received data. Further, the switching element driver IC 14 detects an operation state of the switching element TR1, and outputs a detection signal. The switching element driver IC 14 is equipped with photocouplers 140, 141 and 142, a driver circuit 143, a detection circuit 144, and a setting circuit 145.

The photocoupler 140 (a first insulation circuit) receives a driving signal transmitted from the microcomputer 15 in the low voltage side, generates an output signal and outputs the generated output signal to the driver circuit 143 in a high voltage side, where in the photocoupler 140, the output signal is electrically insulated from the received driving signal.

An anode of a photodiode in an input side of the photocopier 140 is connected to the microcomputer 15 through a terminal of the switching element driver IC 14. A cathode of the photodiode in the photocoupler 140 is connected to the ground LG in the low voltage side through a terminal of the switching element driver IC 14.

A collector of a photo-transistor in the output side of the photocoupler 140 is connected to the driver circuit 143 in the switching element driver IC 14. An emitter of the photo-transistor is connected to the ground HG in the high voltage side through a terminal of the switching element driver IC 14. In the photocoupler 140 shown in FIG. 1, the ground LG in the low voltage side is electrically insulated from the ground HG in the high voltage side.

The photocoupler 141 (a second insulation circuit) receives an abnormality signal generated by and transmitted from the detection circuit 144 in the input side (the high voltage side). The photocoupler 141 outputs the received abnormality signal to the microcomputer 15 in the output side (the low voltage side). Further, the photocoupler 141 receives setting data transmitted from the driver circuit 143 and the detection circuit 144 in the high voltage side, and transmits the received setting data to the microcomputer 15 in the low voltage side, wherein the input side (the high voltage side) is electrically insulated from the output side (the low voltage side).

An anode of a photodiode in the input side of the photocoupler 141 is connected to the driver circuit 143 and the detection circuit 144 in the switching element driver IC 14. A cathode of the photodiode in the photocoupler 141 is connected to the ground HG in the high voltage side through a terminal of the switching element driver IC 14.

A collector of a photo-transistor in the output side (the low voltage side) of the photocoupler 141 is connected to the microcomputer 15 through a terminal of the switching element driver IC 14. An emitter of the photo-transistor is connected to the ground LG in the low voltage side through a terminal of the switching element driver IC 14.

In the switching element driver IC 14, the photocoupler 142 (a third insulation circuit) receives setting data to be used by the driver circuit 143 and the detection circuit 144 transmitted from the microcomputer 15 in the low voltage side, and outputs the received setting data to the setting circuit 145 in the high voltage side. In the photocoupler 142, the input side (the low voltage side) of the setting data is electrically insulated from the output side (the high voltage side).

An anode of a photodiode in the input side of the photocoupler 142 is connected to the microcomputer 15 through a terminal of the switching element driver IC 14. A cathode of the photodiode in the photocoupler 142 is connected to the ground LG in the low voltage side through a terminal of the switching element driver IC 14.

In the switching element driver IC 14, a collector of a photo-transistor in the output side of the photocoupler 142 is connected to the driver circuit 143. An emitter of the photo-transistor is connected to the ground HG in the high voltage side through a terminal of the switching element driver IC 14.

The driver circuit 143 receives the setting data transmitted from the setting circuit 145, and operates on the basis of the received setting data. Further, the driver circuit 143 receives the driving signal transmitted from the microcomputer 15 through the photocoupler 140, and drives the switching element TR1 on the basis of the received driving signal. Specifically, the driver circuit 143 controls a voltage of the gate G of the switching element TR1 on the basis of a gate threshold voltage when the switching element TR1 is turned on/off, where the gate threshold voltage is indicated by the received setting data transmitted from the setting circuit 145. The driver circuit 143 drives the switching element TR1 on the basis of the received driving signal.

The driver circuit 143 has initial setting data which have been set beforehand. Accordingly, when receiving no setting data transmitted from the setting circuit 145, the driver circuit 143 operates on the basis of the initial setting data. After the setting circuit 145 provides the setting data, the driver circuit 143 receives and outputs the setting data to the photocoupler 141 every constant time period. In the switching element driver IC 14, the driver circuit 143 is connected to the setting circuit 145. Further, as shown in FIG. 1, the driver circuit 143 is connected to the collector of the photo-transistor in the output side of the photocoupler 140 and the anode of the photodiode in the input side of the photocoupler 141. The driver circuit 143 is connected to the gate of the switching element through a terminal of the switching element driver IC 14.

The detection circuit 144 operates on the basis of the setting data transmitted from the setting circuit 145. The detection circuit 144 detects the operation condition of the switching element TR1, and outputs the detection result to the photocoupler 141. Specifically, the detection circuit 144 detects occurrence of abnormality such as excess current and short circuit on the basis of the setting data such as an abnormality current judgment threshold value and a voltage of the current sense resistance 10. The detection circuit 144 outputs a detection result to the photocoupler 141. That is, when detecting the occurrence of abnormality, the detection circuit 144 generates an abnormality signal as the detection result, and outputs the abnormality signal to the photocoupler 141.

Further, the detection circuit 144 detects occurrence of temperature abnormality of the switching element TR1 on the basis of the abnormality temperature threshold value as the setting data and the voltage of each of the temperature sensitive diodes 11, 12 and 13. When detecting the occurrence of temperature abnormality, the detection circuit 144 generates an abnormality signal as the detection result and outputs the abnormality signal to the photocoupler 141.

The detection circuit 144 has initial setting data which have been set beforehand. Accordingly, when receiving no setting data transmitted from the setting circuit 145, the detection circuit 144 operates on the basis of the initial setting data.

After the setting circuit 145 provides the setting data, the detection circuit 144 receives and outputs the setting data to the photocoupler 141 every constant time period. In the switching element driver IC 14, the detection circuit 144 is connected to the setting circuit 145 and the anode of the photodiode in the input side of the photocoupler 141. The detection circuit 144 is connected to both the end terminals of the current sense resistance 10 and the anode of the temperature sensitive diode 11 through terminals of the switching element driver IC 14.

The setting circuit 145 receives the setting data transmitted from the microcomputer 15 through the photocoupler 142 and transmits the received setting data to the driver circuit 143 and the detection circuit 144. Specifically, the setting circuit 145 supplies the gate voltage threshold value of the switching element TR1 to the driver circuit 143 and an abnormality current judgment threshold value and the abnormality temperature threshold value to the detection circuit 144.

In the switching element driver IC 14, the setting circuit 145 is connected to the collector of the photo-transistor in the output side of the photocoupler 142, the driver circuit 143 and the detection circuit 145.

The microcomputer 15 outputs the setting data to the photocoupler 142 in order to determine the operation of the driver circuit 143 and the detection circuit 144, and output the driving signal to the photocoupler 140 in order to drive the switching element TR1. Further, the microcomputer 15 performs the process on the basis of the setting data and the abnormality signal of the driver circuit 143 and the detection circuit 144, when receiving the setting data and the abnormality signal for the driver circuit 143 and the detection circuit 144 transmitted through the photocoupler 141.

The microcomputer 15 outputs the setting data such as the gate threshold voltage value in order to turn on/off the switching element TR1, and the abnormality current judgment threshold value and the abnormality temperature judgment threshold value in order to determine the operation of the detection circuit 144.

Further, the microcomputer 15 detects whether or not the setting data for the driver circuit 143 and the detection circuit 144 transmitted through the photocoupler 141 are the same as the setting data to be set. When the detection result indicates negation, i.e. the setting data are not the same as the setting data to be determined, the microcomputer 15 outputs the setting data again. The microcomputer 15 outputs again the setting data to the setting circuit 145. The microcomputer 15 is connected to an anode of the photodiode in the input side of each of the photocouplers 140 and 142, and a collector of the photo-transistor in the output side of the photocoupler 141.

A description will now be given of the operation of the switching element with reference to FIG. 1.

The microcomputer 15 shown in FIG. 1 outputs the setting data to the photocoupler 142, where the setting data determine the operation of each of the driver circuit 143 and the detection circuit 144. Specifically, the setting data contain the gate voltage threshold value for determining the turned on and off operation of the driver circuit 143, and the abnormality current judgment threshold value and the abnormality temperature judgment threshold value for determining the operation f the detection circuit 144. The photocoupler 142 transmits the setting data provided from the microcomputer 15 to the setting circuit 145, wherein the input side as the low voltage side is electrically insulated from the output side as the high voltage side in the photocoupler 142. Specifically, the photocoupler 142 outputs the gate threshold value as the setting data to the driver circuit 143, and outputs the abnormality current judgment threshold value and the abnormality temperature judgment threshold value as the setting data to the detection circuit 144.

When receiving the setting data, each of the driver circuit 143 and the detection circuit 144 starts to operate. On the other hand, when an incorrect operation occurs in the driver circuit 143 and the detection circuit 144 for some reason, each of the driver circuit 143 and the detection circuit 144 starts the operation on the basis of the initial setting data.

After receiving the setting data, the driver circuit 143 and the detection circuit 144 outputs the setting data to the photocoupler 141 every constant time period. When receiving the setting data transmitted from the driver circuit 143 and the detection circuit 144, the photocoupler 141 outputs the received setting data to the microcomputer, wherein the input side as the high voltage side is electrically insulated from the output side as the low voltage side in the photocoupler 141. When receiving the setting data transmitted from the driver circuit 143 and the detection circuit 144 through the photocoupler 142, the microcomputer 15 operates on the basis of the received setting data. Specifically, the microcomputer 15 detects whether or not the received setting data are equal to the setting data to be supplied to the driver circuit 143 and the detection circuit 144. If the detection result indicates negation the microcomputer 15 outputs again the setting data to the photocoupler 142.

After this, the microcomputer 15 outputs the driving signal to the photocoupler 140 in order to drive the switching element TR1. When receiving the driving signal, the photocoupler 140 transmits the driving signal to the driver circuit 143, wherein the input side as the low voltage side is electrically insulated from the output side as the high voltage side in the photocoupler 140.

The driver circuit 143 operates on the basis of the setting data transmitted from the setting circuit 145 and drives the switching element TR1 on the basis of the received driving signal. Specifically, the driver circuit 143 adjusts the gate voltage of the gate G of the switching element TR1 on the basis of the gate voltage threshold value, as the setting data, to be used when the switching element TR1 is turned on and off.

When the driver circuit 143 drives the switching element TR1, a current flows in the switching element TR1, and a temperature of the switching element TR1 increases. The detection circuit 144 operates on the basis of the setting data transmitted from the setting circuit 145, and detects the operation state of the switching element TR1. The detection circuit outputs the detection result to the photocoupler 141. Specifically, the detection circuit 144 detects occurrence of excess current and short circuit on the basis of the abnormality current judgment threshold value and the voltage detected through the current sense resistance 10. The detection circuit 144 outputs an abnormality signal as the detection result to the photocoupler 141.

Further, the detection circuit 144 detects occurrence of abnormality of the temperature of the switching element TR1, and generates an abnormality signal as the detection result, and outputs the generated abnormality signal to the photocoupler 141. The photocoupler 141 transmits the received abnormality signal as the detection result to the microcomputer 15, wherein the input side as the high voltage side is electrically insulated from the output side as the low voltage side in the photocoupler 141.

When receiving the abnormality signal, the microcomputer 15 operates on the basis of the received abnormality signal. Specifically, the microcomputer 15 prohibits the transmission of the driving signal to the driver circuit 143 when detecting the occurrence of excess current and short circuit in the switching element TR1.

Next, a description will now be given of the effects of the switching element driver IC according to the first exemplary embodiment.

The switching element driver IC according to the first exemplary embodiment is comprised of the photocoupler 140, the photocoupler 141, the photocoupler 142, the driver circuit 143, the detection circuit 144 and the setting circuit 145, where the setting circuit 145 is connected to the photocoupler 142, the driver circuit 143 and the detection circuit 144, and the setting circuit 145 provides the setting data transmitted from the microcomputer 15 through the photocoupler 142 to the driver circuit 143 and the detection circuit 144. The driver circuit 143 and the detection circuit 144 operates on the basis of the received setting data provided from the setting circuit 145. It is therefore possible for the microcomputer 15 to provide the setting data into the driver circuit 143 and the detection circuit 144 through the photocoupler 142 and the setting circuit 145. This makes it possible to eliminate any outside device arranged at the outside of the switching element driver device 1 for providing the setting data to the switching element driver IC, and to further decrease the number of terminals of the switching element driver IC, and to reduce the entire size of the switching element driver IC.

In the structure of the switching element driver IC according to the first exemplary embodiment, the driver circuit 143 is connected to the photocoupler 141, and the driver circuit 143 and the detection circuit 144 outputs the received setting data to the photocoupler 141 after receiving the setting data transmitted from the setting circuit 145. This structure makes it possible for the microcomputer 15 to detect whether or not the setting data provided to the setting circuit 145 are equal to the setting data which have been received by the driver circuit 143 and the detection circuit 144. It is thereby possible to avoid incorrect operation caused by using other setting data which are different from the setting data provided from the microcomputer 15 to the driver circuit 143 and the detection circuit 144 through the setting circuit 145. This makes it possible to increase the reliability of the switching element driver IC.

In the structure of the switching element driver IC according to the first exemplary embodiment, each of the driver circuit 143 and the detection circuit 144 outputs the received setting data every constant time period. This makes it possible for the microcomputer 15 to detect whether or not the setting data provided to the setting circuit 145 are equal to the setting data which have been received by the driver circuit 143 and the detection circuit 144 at fixed intervals. It is thereby possible to certainly avoid occurrence of incorrect operation caused by using other setting data different from the setting data which have been provided from the microcomputer 15 to the driver circuit 143 and the detection circuit 144 through the setting circuit 145. This makes it possible to increase the reliability of the switching element driver IC.

In the structure of the switching element driver IC according to the first exemplary embodiment, the driver circuit 143 and the detection circuit 144 have the setting data provided from the microcomputer 15. If the microcomputer 15 or the setting circuit 145 provides no setting data to the driver circuit 143 and the detection circuit 144, each of the driver circuit 143 and the detection circuit 144 operates on the basis of the initial setting data which have been stored beforehand. Even if each of or both the driver circuit 143 and the detection circuit 144 do not receive any setting data, it is possible to prevent occurrence of incorrect operation on the basis of incorrect setting data.

Second Exemplary Embodiment

A description will be given of a switching element driver device 2 equipped with a switching element driver IC 24 according to the second exemplary embodiment with reference to FIG. 2.

Figure 2:
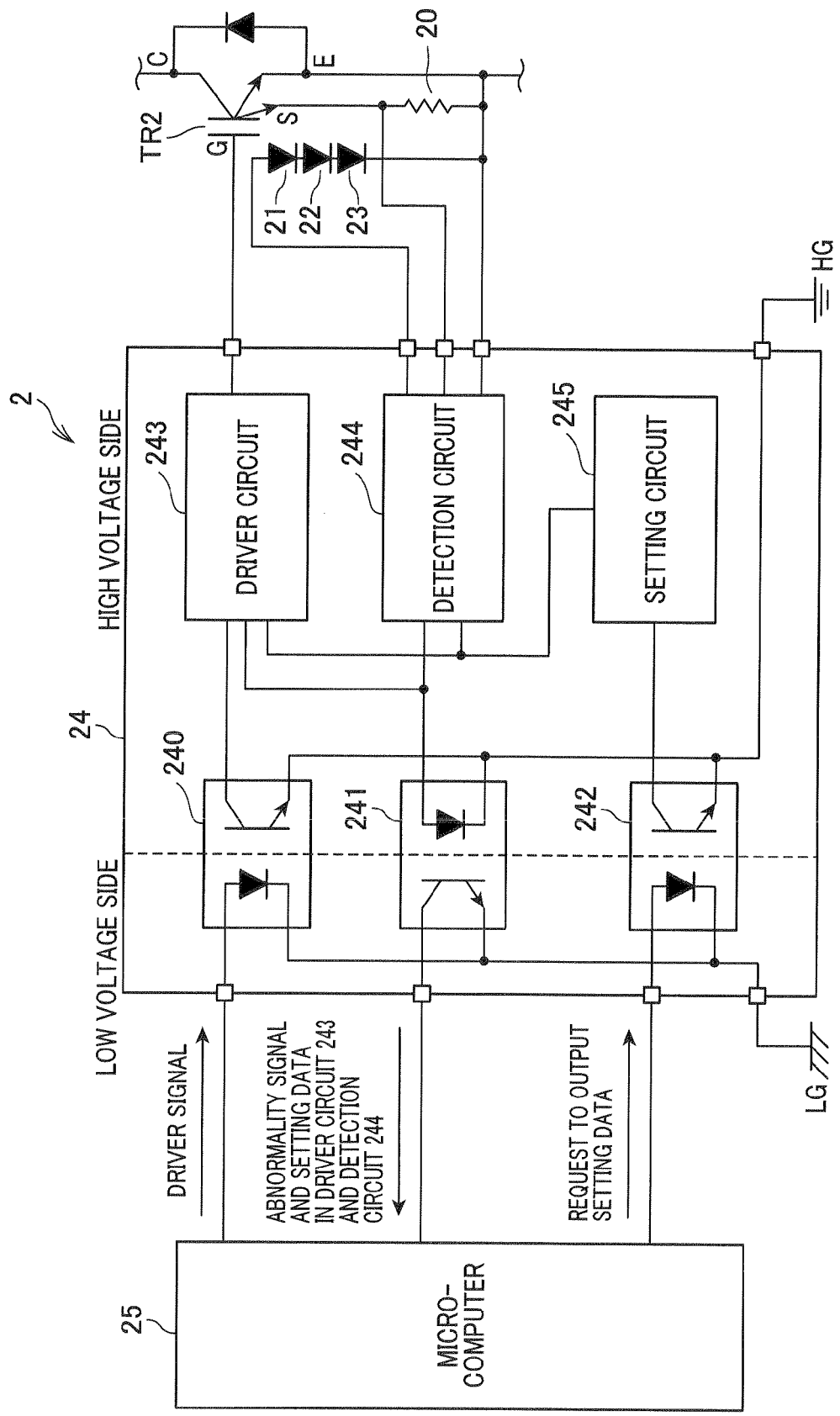
FIG. 2 is a view showing a circuit structure of a switching element driver device equipped with a switching element driver IC according to a second exemplary embodiment of the present invention.

FIG. 2 is a view showing a circuit structure of the switching element driver device 2 equipped with the switching element driver IC 24 according to the second exemplary embodiment.

In the structure of the switching element driver IC 14 in the switching element driver device 1 according to the first exemplary embodiment previously described, each of the driver circuit 143 and the detection circuit 144 outputs the received setting data every constant time period. On the other hand, in the structure of the switching element driver IC according to the second exemplary embodiment, each of the driver circuit 143 and the detection circuit 144 outputs the received setting data only when receiving a setting data output request from a microcomputer 25. Other components and the operation of the switching element driver IC according to the second exemplary embodiment are equal to them of the switching element driver IC according to the first exemplary embodiment.

A description will now be given of the structure of the switching element device 2 equipped with the switching element driver IC 24 according to the second exemplary embodiment with reference to FIG. 2.

As shown in FIG. 2, the switching element driver device 2 is comprised of a current sense resistance 20, temperature sensitive diodes 21, 22 and 23, a switching element driver IC 24, and a microcomputer 25. The current sense resistance 20 and the temperature sensitive diodes 21, 22 and 23 have the same structure of the current sense resistance 10, temperature sensitive diodes 11, 12 and 13 used in the switching element driver IC 14 shown in FIG. 1, respectively.

The switching element driver IC 24 is comprised of photocouplers 240, 241 and 242, a driver circuit 243, a detection circuit 244 and a setting circuit 245.

The photocoupler 240 (first insulation circuit) and the photocoupler 241 (second insulation circuit) in the switching element driver IC 24 have the same structure of the photocouplers 140 and 141, respectively used in the switching element driver IC 14 according to the first exemplary embodiment.

The photocoupler 242 (a third insulation circuit) shown in FIG. 2 is different in function from the photocoupler 142 shown in FIG. 1. That is, the photocoupler 242 receives a setting data output request which requires outputting the setting data, which is transmitted from the microcomputer 25, and transmits the received setting data output request to the setting circuit 245, wherein the low voltage side as the input side is electrically insulated from the high voltage side as the output side in the photocoupler 242. Other structure and operation of the photocoupler 242 is equal to the photocoupler 142.

The driver circuit 243 shown in FIG. 2 is different in structure and function from the driver circuit 143 shown in FIG. 1. The driver circuit 243 outputs the received setting data transmitted from the setting circuit 245 only when receiving the setting data output request transmitted from the microcomputer 25 through the photocoupler 242 and the setting circuit 245. Other components and operation of the driver circuit 243 shown in FIG. 1 are equal to those in the driver circuit 143 shown in FIG. 1.

The detection circuit 244 shown in FIG. 2 is different in structure and function from the detection circuit 144 shown in FIG. 1. The detection circuit 244 outputs the received setting data transmitted from the setting circuit 245 only when receiving the setting data output request transmitted from the microcomputer 25 through the photocoupler 242 and the setting circuit 245. Other components and operation of the detection circuit 244 shown in FIG. 2 are the same of those in the detection circuit 144 shown in FIG. 1.

The setting circuit 245 in the switching element driver IC 24 according to the second exemplary embodiment shown in FIG. 2 is different in structure and function from the setting circuit 145 in the switching element river IC 14 according to the first exemplary embodiment shown in FIG. 1. The setting circuit 245 in the switching element driver IC 24 receives the setting data output request transmitted from the microcomputer 25 through the photocoupler 242 and outputs the received setting data output request to the driver circuit 243 and the detection circuit 244. Other components and operations of the setting circuit 245 shown in FIG. 2 are the same of those in the setting circuit 145 shown in FIG. 1.

The microcomputer 25 shown in FIG. 2 is different in function from the microcomputer 15 shown in FIG. 1. The microcomputer 25 outputs the setting data output request to the photocoupler 242, where the setting data output request instructs the driver circuit 243 and the detection circuit 244 to output the received setting data. Other functions of the microcomputer 25 are same as those of the microcomputer 15 shown in FIG. 1.

A description will now be given of the operation to output the setting data from the driver circuit 243 and the detection circuit 244 in the switching element driver device 2 according to the second exemplary embodiment shown in FIG. 2.

As shown in FIG. 2, when necessary, the microcomputer 25 outputs the setting data output request to the photocoupler 242 in order that the driver circuit 243 and the detection circuit 244 output the setting data to the microcomputer 25 through the photocoupler 241. When receiving the setting data output request transmitted from the microcomputer 25, the photocoupler 242 transmits the received setting data output request to the setting circuit 245, wherein the input side as the low voltage side is electrically insulated from the output side as the high voltage side in the photocoupler 242. When receiving the setting data output request transmitted from the photocoupler 242, the setting circuit 245 outputs the received setting data output request to the driver circuit 243 and the detection circuit 244. When receiving the setting data output request, each of the driver circuit 243 and the detection circuit 244 outputs the setting data to the photocoupler 241. When receiving the setting data transmitted from the driver circuit 243 and the detection circuit 244, the photocoupler 241 sequentially transmits the received setting data to the microcomputer 25, wherein the input side as the high voltage side is electrically insulated from the output side as the low voltage side in the photocoupler 241. When receiving the setting data transmitted from the driver circuit 243 and the detection circuit 244 through the photocoupler 241, the microcomputer 25 performs the necessary operation on the basis of the received setting data transmitted through the photocoupler 141, similar to the operation of the microcomputer 15 in the switching element driver device 1 according to the first exemplary embodiment shown in FIG. 1.

A description will now be given of the effects of the switching element driver device 2 equipped with the switching element driver IC 24 according to the second exemplary embodiment.

Because the components in the switching element driver device 2 according to the second exemplary embodiment are equal to those in the switching element driver device 1 according to the first exemplary embodiment, they have the same effects.

Further, according to the switching element driver device 2 equipped with the switching element driver IC 24 according to the second exemplary embodiment, each of the driver circuit 243 and the detection circuit 244 transmits the setting data to the microcomputer 25 when receiving the setting data output request from the microcomputer 25. This makes it possible for the microcomputer 25 to recognize at a necessary time whether or not the setting data received by the driver circuit 243 and the detection circuit 244 are equal to the setting data transmitted from the setting circuit 245 under the control of the microcomputer 25. When incorrect operation occurs, the microcomputer 25 promptly detects the setting data in the driver circuit 243 and the detection circuit 244, and performs the necessary countermeasure.

Still further, according to the switching element driver device 2 equipped with the switching element driver IC 24 according to the second exemplary embodiment, the setting data output request from the microcomputer 25 is transmitted to the driver circuit 243 and the detection circuit 244 through the photocoupler 242 and the setting circuit 245. This structure makes it possible to promptly transmit the setting data output request to the driver circuit 243 and the detection circuit 244 without increasing the number of terminals in the low voltage side of the switching element driver IC 24.

Third Exemplary Embodiment

A description will be given of a switching element driver device 3 equipped with a switching element driver IC 34 according to the second exemplary embodiment with reference to FIG. 3.

Figure 3:
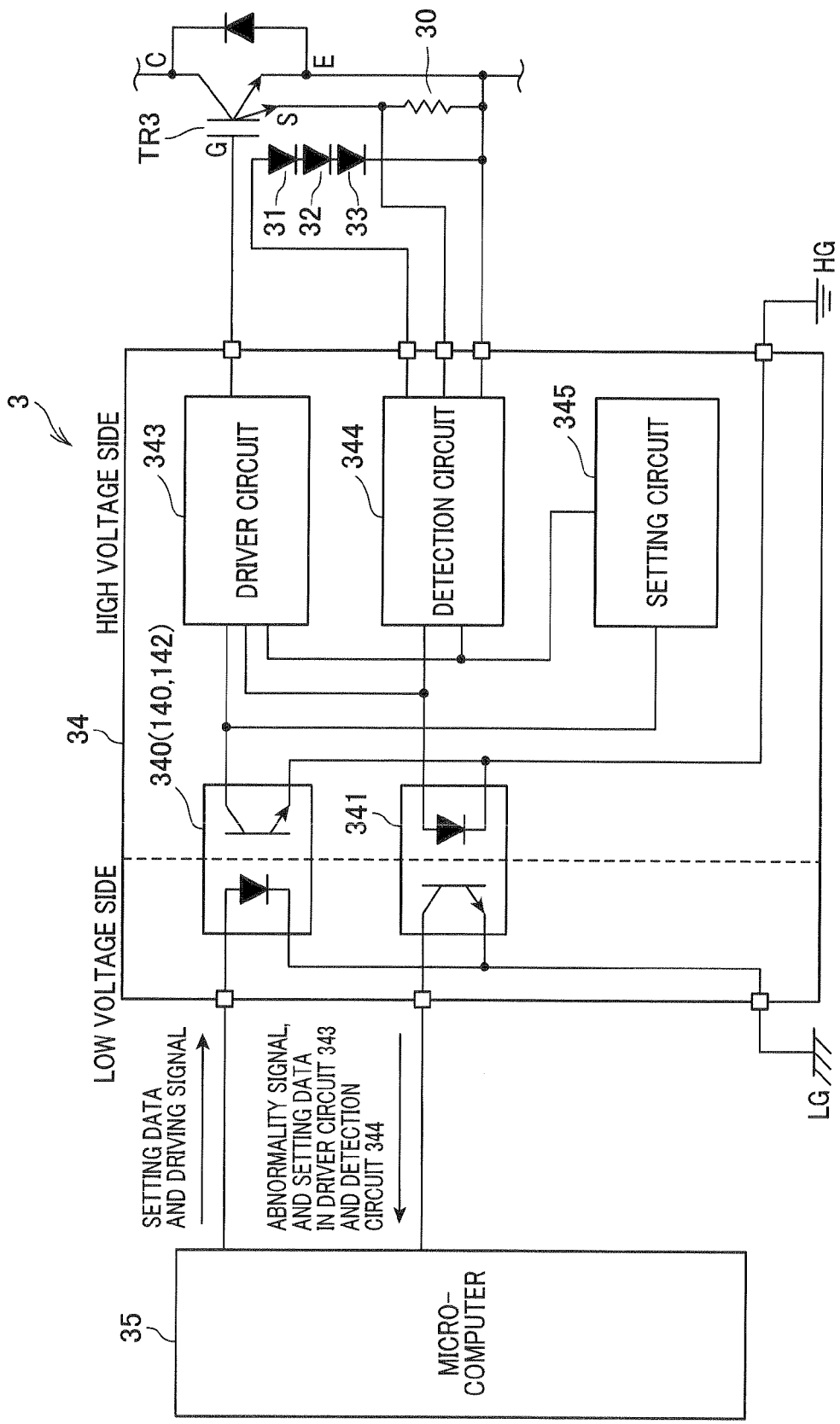
FIG. 3 is a view showing a circuit structure of a switching element driver device equipped with a switching element driver IC according to a third exemplary embodiment of the present invention.

FIG. 3 is a view showing a circuit structure of the switching element driver device 3 equipped with a switching element driver IC 34 according to the third exemplary embodiment.

In the structure of the switching element driver IC 34 in the switching element driver device 3 according to the third exemplary embodiment shown in FIG. 3, a photocoupler 340 (140, 142) has both the function of the photocoupler 140 and the function of the photocoupler 142 shown in FIG. 1. Other components of the switching element driver IC 34 shown in FIG. 3 are the same as those of the switching element driver IC 14 shown in FIG. 1.

A description will now be given of the structure of the switching element driver device 3 according to the third exemplary embodiment with reference to FIG. 3.

As shown in FIG. 3, the switching element driver device 3 is comprised of a current sense resistance 30, temperature sensitive diodes 31, 32 and 33, the switching element driver IC 34, and a microcomputer 35. The current sense resistance 30 and the temperature sensitive diodes 31, 32 and 33 shown in FIG. 3 have the same structure of the current sense resistance 10, temperature sensitive diodes 11, 12 and 13 used in the switching element driver IC 14 shown in FIG. 1, respectively.

The switching element driver IC 34 is comprised of a photocoupler 340 (140,142) and a photocoupler 341, a driver circuit 343, a detection circuit 344 and a setting circuit 345.

The photocoupler 340 (first insulation circuit) and the photocoupler 341 (second insulation circuit) shown in FIG. 3 have the same structure and operation of the photocoupler 140 and the photocoupler 141, respectively.

In the structure of the switching element driver IC 34 according to the third exemplary embodiment, the photocoupler 340 has the same function as the photocoupler 142 (third insulation circuit) and the same function as the photocoupler 140 (first insulation circuit). That is, the photocoupler 340 receives setting data transmitted from the microcomputer 35 in the low voltage side, and transmits the received setting data to the setting circuit 345, wherein the low voltage side as the input side is electrically insulated from the high voltage side as the output side. In the structure of the switching element driver IC 34, a collector of a photo-transistor in the output side of the photocoupler 340 is connected to the driver circuit 343 and the setting circuit 345.

The driver circuit 343, the detection circuit 344 and the setting circuit 345 have the same structure of the driver circuit 143, the detection circuit 144 and the setting circuit 145, respectively.

The microcomputer 35 outputs the setting data to the photocoupler 340 (140,142) in the time period when the microcomputer 35 does not transmit a driving signal to the photocoupler 340 (140,142). Other functions of the microcomputer 35 shown in FIG. 3 are the same as the functions of the microcomputer 15 used in the first exemplary embodiment shown in FIG. 1.

Next, a description will now be given of the operation to set the setting data in the switching element driver device 3 according to the third exemplary embodiment while explaining the difference from the first exemplary embodiment.

The microcomputer 35 shown in FIG. 3 outputs the setting data during the period in which the microcomputer 35 does not output the driving signal to the photocoupler 340 (140, 142). When receiving the setting data transmitted from the microcomputer 35, the photocoupler 340 (140,142) transmits the received setting data to the setting circuit 345. Similar to the first exemplary embodiment, the setting circuit 345 sets the setting data transmitted through the photocoupler 340 (140,142) into the driver circuit 343 and the detection circuit 344.

Next, a description will now be given of the effects of the switching element driver device 3 equipped with the switching element driver IC 34 according to the third exemplary embodiment.

The components in the switching element driver device 34 according to the third exemplary embodiment shown in FIG. 3 which are the same as those in the switching element driver device 14 according to the first exemplary embodiment shown in FIG. 1 have the same effects.

Further, because the photocoupler 340 (140,142) has the same function as the photocoupler 142 (third insulation circuit) and the same function as the photocoupler 140 (first insulation circuit), the structure of the switching element driver IC 34 has the less number of terminals and the reduced size when compared with the structure of the switching element driver IC 14 according to the first exemplary embodiment. This makes it possible to reduce the entire size of the switching element driver device 3.

According to the third exemplary embodiment, the setting circuit 345 provides setting data to the driver circuit 343 and the detection circuit 345 during the period in which the microcomputer 35 transmits the driving signal to the switching element driver IC 34. This makes it possible to reliably transmit the setting data and the driving signal from the microcomputer 35 to the driver circuit 343 and the detection circuit 344 through the photocoupler 340 (140, 142) because the photocoupler 340 (140,142) has the same function as the photocoupler 142 (third insulation circuit) and the same function as the photocoupler 140 (first insulation circuit).

As previously described in detail, according to the first, second and third exemplary embodiments, the setting data have the gate voltage threshold value when the switching element TR1 is turned on and off, the abnormality current judgment threshold value, and the abnormality temperature judgment threshold value. However, the concept of the present invention is not limited by this. That is, it is sufficient for the setting data to contain various data unless the setting data determine the operation of the driver circuit and the detection circuit.

Still further, according to the first, second and third exemplary embodiments, the switching element driver device equipped with the switching element driver IC uses data indicating the operation state of the switching element TR1, i.e. an occurrence of abnormality such as excess current, short circuit and an abnormality temperature. However, the concept of the present invention is not limited by this. It is possible for the switching element driver device to use various types of data such as a temperature, a current of the switching element TR1 other than the data indicating occurrence of abnormality.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A switching element driver integrated circuit comprising:
    a first insulation circuit configured to receive a driving signal transmitted from a control device and transmit the received driving signal, wherein an input side is insulated from an output side in the first insulation circuit;
    a driver circuit connected to the first insulation circuit and configured to receive the driving signal transmitted from the first insulation circuit, and drive a switching element on the basis of the received driving signal;
    a detection circuit configured to detect operation state of the switching element, and configures to generate a detection signal on the basis of the detection result, and configured to output the detection signal;
    a second insulation circuit connected to the detection circuit and configured to receive the detection result transmitted from the detection circuit and output the detection signal to the control device, wherein an input side is electrically insulated from an output side in the second insulation circuit;
    a third insulation circuit configured to receive setting data transmitted from the control device and transmit the setting data to the driver circuit and the detection circuit, wherein an input side is electrically insulated from an output side in the third insulation circuit; and
    a setting circuit connected to the third insulation circuit, the driver circuit and the detection circuit, and configured to receive the setting data transmitted from the third insulation circuit and provide the received setting data to the driver circuit and the detection circuit, wherein the driver circuit and the detection circuit operates on the basis of the received setting data.

2. The switching element driver integrated circuit according to claim 1, wherein the driver circuit is connected to the second insulation circuit, and the driver circuit and the detection circuit transmit the received setting data to the control device through the second insulation circuit after the driver circuit and the detection circuit receive the setting data transmitted from the setting circuit.

3. The switching element driver integrated circuit according to claim 2, wherein the driver circuit and the detection circuit transmit the received setting data every constant time period to the control device through the second insulation circuit.

4. The switching element driver integrated circuit according to claim 2, wherein the driver circuit and the detection circuit output the received setting data to the control device when the third insulation circuit receives a setting data output request, which is transmitted from the control device.

5. The switching element driver integrated circuit according to claim 4, wherein the setting circuit receives the setting data output request through the third insulation circuit, and transmits the received setting data output request to the driver circuit and the detection circuit.

6. The switching element driver integrated circuit according to claim 1, wherein each of the driver circuit and the detection circuit has initial setting data which have been set therein beforehand, and operates on the basis of the initial setting data if the setting circuit does not provide setting data to the driver circuit and the detection circuit.

7. The switching element driver integrated circuit according to claim 1, wherein the first insulation circuit further has a function of the third insulation circuit.

8. The switching element driver integrated circuit according to claim 7, wherein the first insulation circuit receives the setting data during a period in which the first insulation circuit receives no driving signal.

9. The switching element driver integrated circuit according to claim 1, wherein each of the first insulation circuit, the second insulation circuit and the third insulation circuit is comprised of a photocoupler, and the control device is comprised of a microcomputer.

10. A switching element driver device for driving a switching element comprising:
    a microcomputer;
    a switching element driver integrated circuit connected to the microcomputer;
    a current sense resistance connected to the switching element driver integrated circuit; and
    temperature sensitive diodes connected in series to the switching element driver integrated circuit,
    wherein the switching element driver integrated circuit comprising:
    a first photocoupler connected to the microcomputer configured to receive a driving signal transmitted from the microcomputer and transmit the received driving signal, wherein an input side is insulated from an output side in the first photocoupler;
    a driver circuit connected to the first photocoupler and the switching element and configured to receive the driving signal transmitted from the first photocoupler, and drive the switching element on the basis of the received driving signal;
    a detection circuit configured to detect an operation state of the switching element through the current sense resistance and the temperature sensitive diodes;
    a second photocoupler connected to the microcomputer and the detection circuit and configured to output a detection result of the detection circuit to the microcomputer, wherein an input side is electrically insulated from an output side in the second photocoupler;
    a third photocoupler connected to the microcomputer and configured to receive setting data transmitted from the microcomputer, wherein an input side is electrically insulated from an output side in the third photocoupler; and
    a setting circuit connected to the third photocoupler, the driver circuit and the detection circuit, and configured to receive the setting data transmitted from the third photocoupler and provide the received setting data to the driver circuit and the detection circuit, wherein the driver circuit and the detection circuit operate on the basis of the received setting data.

* * * * *